(12) United States Patent
Zhang et al.

(10) Patent No.: US 12,712,468 B2
(45) Date of Patent: Aug. 18, 2026

(54) SWITCHING CIRCUIT

(71) Applicant: General Electric Company, Schenectady, NY (US)

(72) Inventors: Zheyu Zhang, Clifton Park, NY (US); Satish Prabhakaran, Colonie, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 17/615,304

(22) PCT Filed: May 31, 2019

(86) PCT No.: PCT/US2019/034852

§ 371 (c)(1),
(2) Date: Nov. 30, 2021

(87) PCT Pub. No.: WO2020/242490

PCT Pub. Date: Dec. 3, 2020

(65) Prior Publication Data

US 2022/0224331 A1 Jul. 14, 2022

(51) Int. Cl.
*H02M 7/493* (2007.01)
*H03K 17/687* (2006.01)

(52) U.S. Cl.
CPC ........ *H02M 7/493* (2013.01); *H03K 17/6874* (2013.01)

(58) Field of Classification Search
CPC .... H02M 7/493; H02M 3/158; H02M 3/1584; H03K 17/493
See application file for complete search history.

(56) References Cited

U.S. PATENT DOCUMENTS 6,449,181 B1 * 9/2002 Rieger .................. H02M 7/493 363/59
6,962,872 B2 11/2005 Chudzik et al.
7,107,467 B2 9/2006 Lee et al.
(Continued)

FOREIGN PATENT DOCUMENTS

CN 103001521 B 10/2014
DE 19745578 A1 4/1998
(Continued)

OTHER PUBLICATIONS

International Search Report and Written Opinion, PCT/US2019/034852, Jan. 30, 2020, 30 pages.
(Continued)

*Primary Examiner* — Menatoallah Youssef
*Assistant Examiner* — Colleen J O Toole
(74) *Attorney, Agent, or Firm* — Armstrong Teasdale LLP

(57) ABSTRACT

A switching circuit is provided. The switching circuit includes a first stage, a second stage, a decoupling inductor, a decoupling capacitor, and a semiconductor switch coupled between the first stage and the second stage. The first stage is configured to be coupled to a first bus. The second stage is configured to be coupled to a second bus. The decoupling inductor is coupled to the second stage, and the decoupling capacitor is coupled to the first stage. The semiconductor switch is configured to be controlled to convert a first current received at the first stage to a second current supplied to the second stage.

19 Claims, 2 Drawing Sheets

(56) References Cited

U.S. PATENT DOCUMENTS

Figure 1:
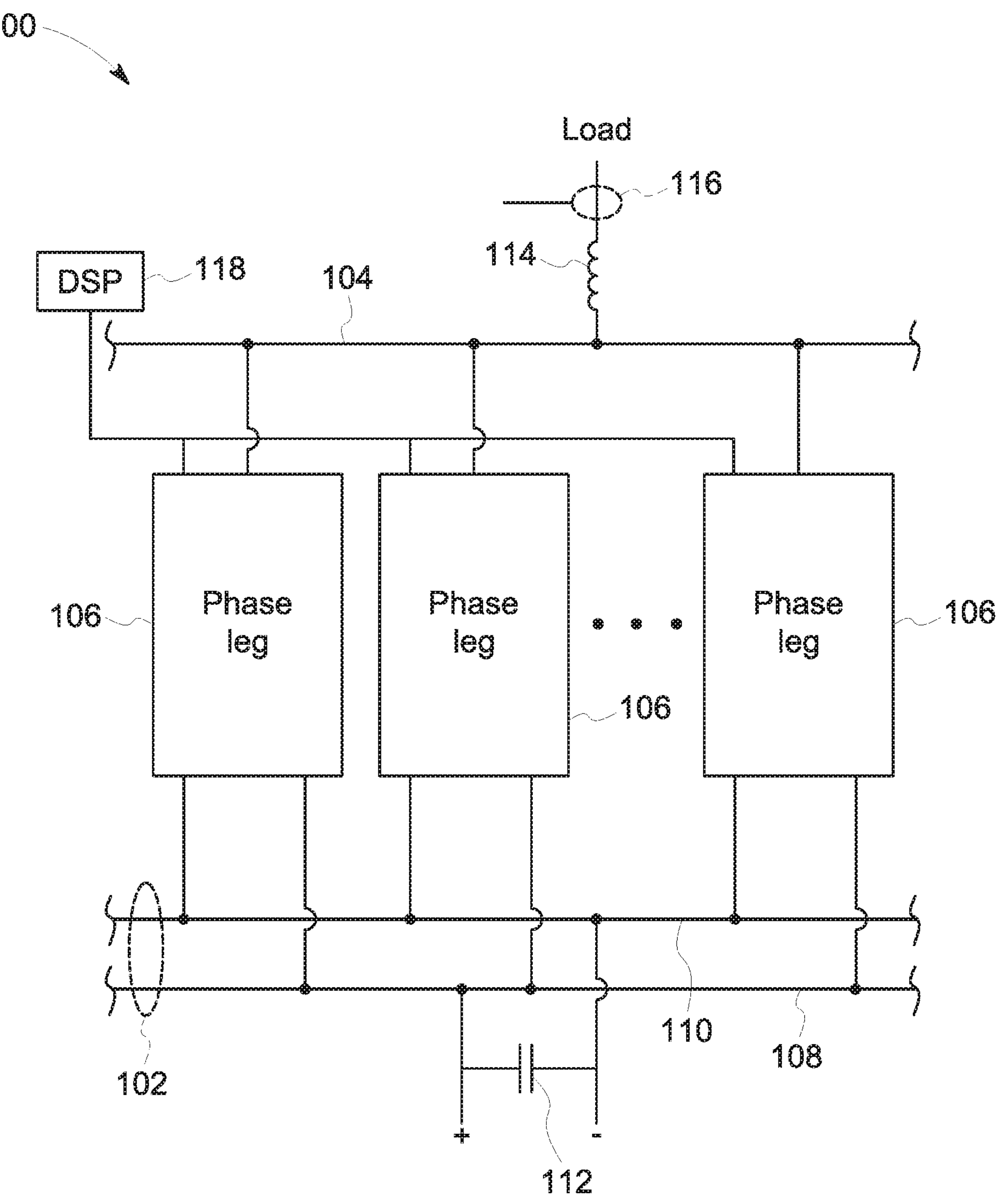

| | | | | |
|---|---|---|---|---|
| 8,631,706 | B2 | 1/2014 | Gruendler et al. | |
| 8,998,454 | B2 | 4/2015 | Wang et al. | |
| 9,101,068 | B2 | 8/2015 | Yun et al. | |
| 9,647,600 | B2 * | 5/2017 | Duguey | H02P 27/08 |
| 9,748,852 | B2 | 8/2017 | Freeman et al. | |
| 2002/0176989 | A1 | 11/2002 | Knudsen et al. | |
| 2003/0048648 | A1 | 3/2003 | Lin et al. | |
| 2016/0248315 | A1 | 8/2016 | Basic et al. | |
| 2016/0344279 | A1 * | 11/2016 | Kanda | H02H 7/1225 |

FOREIGN PATENT DOCUMENTS

| | | | |
|---|---|---|---|
| JP | 2005304218 | A | 10/2005 |
| JP | 2011015455 | A | 1/2011 |

OTHER PUBLICATIONS

Chen et al., "A High-Efficiency Interleaved Single-Phase AC-DC Converter with Common-Mode Voltage Regulation for 380 V DC Microgrids", Article, Oct. 2017, pp. 4128-4135, 2017 IEEE Energy Conversion Congress and Exposition (ECCE), Cincinnati, Ohio, USA.

Xia et al., "A Single Phase Doubly Grounded, PV Inverter using Coupled Inductor with Integrated Magnetics and Active Power Decoupling Technique", Article, Oct. 2017, pp. 8-14, 2017 IEEE Energy Conversion Congress and Exposition (ECCE), Cincinnati, Ohio, USA.

Kamgaing et al., "Design and Modelling of High-Impedance Electromagnetic Surfaces for Switching Noise Suppression in Power Planes", Article, Oct. 10, 2005, pp. 479-489, IEEE Transactions on Electromagnetic Compatibility, vol. 47, No. 3, USA.

Chen Zonxiang et al., "A Single-phase Grid Connected Inverter with a Power Pulsation Decoupling Circuit on the AC Output", Industrial Electronics and Applications (ICIEA), 2012 7th IEEE Conference, Jul. 18, 2012, pp. 1141-1145.

Tahar Zebbadji et al., "Line and Grid Impedance Impact on the Performances of Parallel Modular Inverter System", International Journal of Power Electronics and Drive Systems (IJPEDS), vol. 6, No. 1, Mar. 2015, pp. 100-108.

* cited by examiner

SWITCHING CIRCUIT

BACKGROUND

The field of the disclosure relates generally to switching circuits and, more particularly, to a switching circuit for a phase leg of a paralleled switching circuit.

Most known converter circuits include multiple switching circuits coupled in parallel between a first bus and a second bus, or between an input bus and an output bus. The switching circuits are generally controlled in a manner to produce a conversion, e.g., from direct current (DC) to alternating current (AC), from DC to DC, or from AC to DC. The inclusion of multiple switching circuits, or "phase legs," in parallel generally increases the overall power capacity of, for example, the converter, or any other device within which the switching circuit is implemented.

There are at least two known implementations of switching circuits: device-in-parallel and converter-in-parallel. In a device-in-parallel circuit, the switching devices themselves, e.g., a power metal-oxide semiconductor field-effect transistor (MOSFET), are coupled in parallel between the first bus and the second bus, and the switching devices are controlled by a common gate driver, or gate driver circuit. In a converter-in-parallel circuit, the switching devices are integrated within a converter circuit, and multiple converter circuits are coupled in parallel between the first bus and the second bus. Each parallel converter is then operated independently, e.g., based on a feedback loop. Generally, some known switching circuits perform sufficiently on certain metrics considered in system, e.g., converter, design, including, for example, dynamic current sharing, complexity and cost of control, parasitics, circulating currents among paralleled devices, power derating, scalability, and contribution of noise to external circuits. It would be desirable to have a switching circuit for a phase leg of a converter circuit that improves on at least some of the above-mentioned metrics.

BRIEF DESCRIPTION

In one aspect, a switching circuit is provided. The switching circuit includes a first stage, a second stage, a decoupling inductor, a decoupling capacitor, and a semiconductor switch coupled between the first stage and the second stage. The first stage is configured to be coupled to a first bus. The second stage is configured to be coupled to a second bus. The decoupling inductor is coupled to the second stage, and the decoupling capacitor is coupled to the first stage. The semiconductor switch is configured to be controlled to convert a first current received at the first stage to a second current supplied to the second stage.

In another aspect, a paralleled switching circuit is provided. The paralleled switching circuit includes a first bus, a second bus, and a plurality of phase legs respectively coupled between the first bus and the second bus. The first bus is configured to supply a first current, and the second bus is configured to receive a second current. The plurality of phase legs each include a switching circuit configured to conduct a share of a total current supplied in the second current. The switching circuit includes a decoupling capacitor, a decoupling inductor, and a semiconductor switch coupled between the first bus and the second bus. The decoupling capacitor is coupled across the first bus. The decoupling inductor is coupled in series between the semiconductor switch and the second bus. The semiconductor switch is configured to be controlled to convert the first current to the second current.

DRAWINGS

Figure 2:
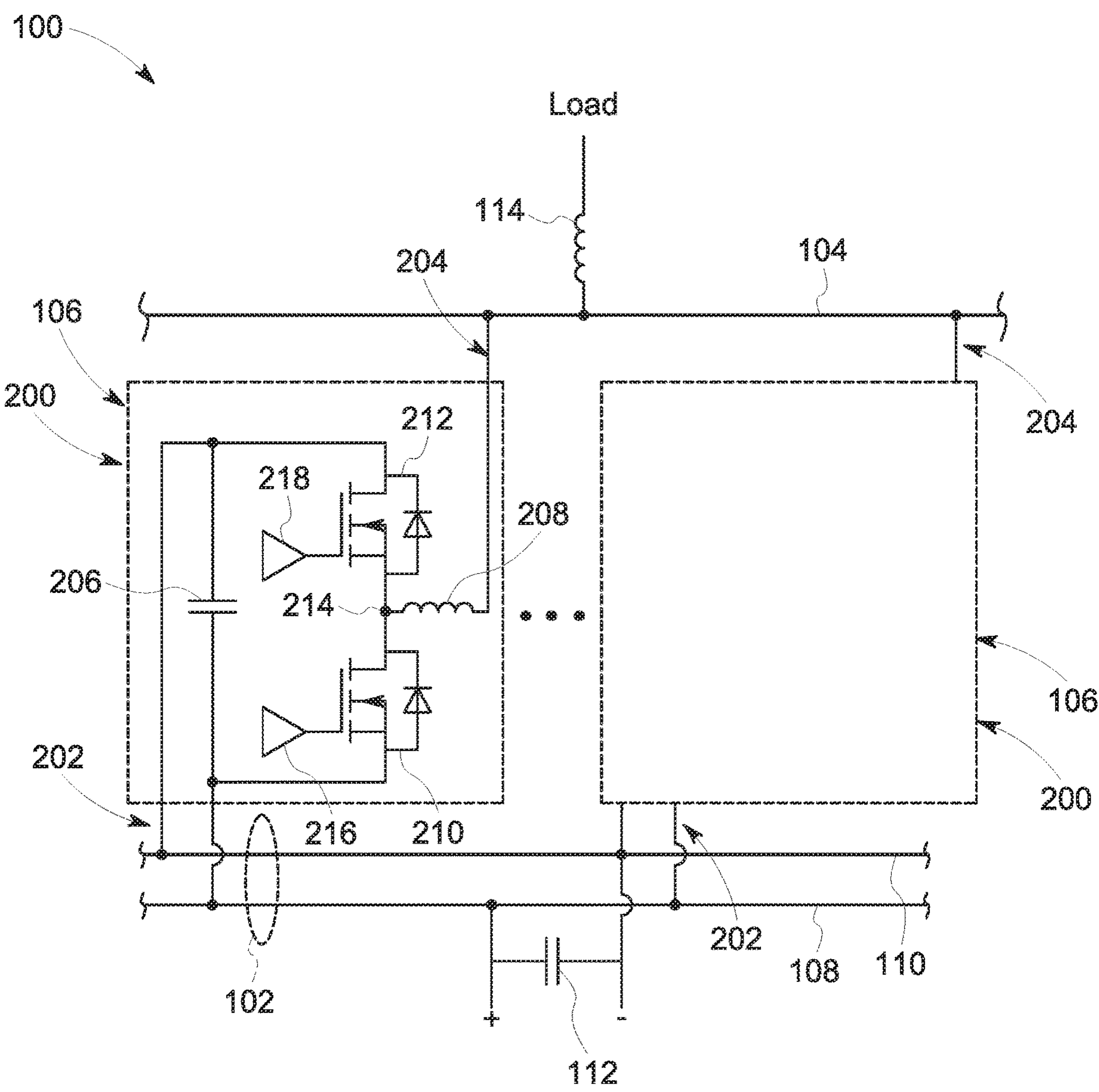

These and other features, aspects, and advantages of the present disclosure will become better understood when the following detailed description is read with reference to the accompanying drawings in which like characters represent like parts throughout the drawings, wherein:

FIG. 1 is a schematic block diagram of an exemplary paralleled switching circuit; and FIG. 2 is a schematic diagram of paralleled switching circuits for use in the paralleled switching circuit shown in FIG. 1.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, a number of terms are referenced that have the following meanings.

The singular forms "a," "an," and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it relates. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

Some embodiments involve the use of one or more electronic processing or computing devices. As used herein, the terms "processor" and "computer" and related terms, e.g., "processing device," "computing device," and "controller" are not limited to just those integrated circuits referred to in the art as a computer, but broadly refers to a processor, a processing device, a controller, a general purpose central processing unit (CPU), a graphics processing unit (GPU), a microcontroller, a microcomputer, a programmable logic controller (PLC), a reduced instruction set computer (RISC) processor, a field programmable gate array (FPGA), a digital signal processing (DSP) device, an application specific integrated circuit (ASIC), and other programmable circuits or processing devices capable of executing the functions described herein, and these terms are used interchangeably herein. The above embodiments are examples only, and thus are not intended to limit in any way the definition or meaning of the terms processor, processing device, and related terms.

In the embodiments described herein, memory may include, but is not limited to, a non-transitory computer-readable medium, such as flash memory, a random access memory (RAM), read-only memory (ROM), erasable programmable read-only memory (EPROM), electrically erasable programmable read-only memory (EEPROM), and non-volatile RAM (NVRAM). As used herein, the term "non-transitory computer-readable media" is intended to be representative of any tangible, computer-readable media, including, without limitation, non-transitory computer storage devices, including, without limitation, volatile and non-volatile media, and removable and non-removable media such as a firmware, physical and virtual storage, CD-ROMs, DVDs, and any other digital source such as a network or the Internet, as well as yet to be developed digital means, with the sole exception being a transitory, propagating signal. Alternatively, a floppy disk, a compact disc-read only memory (CD-ROM), a magneto-optical disk (MOD), a digital versatile disc (DVD), or any other computer-based device implemented in any method or technology for short-term and long-term storage of information, such as, computer-readable instructions, data structures, program modules and sub-modules, or other data may also be used. Therefore, the methods described herein may be encoded as executable instructions, e.g., "software" and "firmware," embodied in a non-transitory computer-readable medium. Further, as used herein, the terms "software" and "firmware" are interchangeable, and include any computer program stored in memory for execution by personal computers, workstations, clients and servers. Such instructions, when executed by a processor, cause the processor to perform at least a portion of the methods described herein. Furthermore, as used herein, the term "real-time" refers to at least one of the time of occurrence of the associated events, the time of measurement and collection of predetermined data, the time to process the data, and the time of a system response to the events and the environment. In the embodiments described herein, these activities and events occur substantially instantaneously.

Embodiments of the present disclosure relate to a switching circuit for a phase leg in, for example, a paralleled switching circuit or a converter. The switching circuit described herein provides a fully-decoupled phase leg that can be paralleled between a first bus and a second bus, such as between a DC bus and an AC bus or between two DC buses, for example. At least some embodiments of the switching circuit described herein include a decoupling inductor at a second stage to stabilize current output over time, e.g., to filter high-frequency noise at the second stage. At least some embodiments of the switching circuit described herein include a decoupling capacitor at a first stage to stabilize voltage input over time, e.g., to filter high-frequency noise at the first stage. Being fully-decoupled from the first and second buses enables a plurality of switching circuits based on the fully-decoupled phase leg circuit described herein to provide desirable levels of current sharing and reduces parasitics and circulating currents. Accordingly, such switching circuits are not subject to de-rating. At least some embodiments of the switching circuit described herein include a common gate driver for each same-positioned switch device of paralleled switching circuits. Switch devices may include, for example, a power semiconductor switch, power MOSFET, insulated gate bipolar transistor (IGBT), bipolar junction transistor (BJT), or other suitable switching device. Control of the switching circuit described herein is, accordingly, simple and cost effective. Embodiments of the switching circuit described herein are efficient and scalable, and contribute little noise to external circuits relative to device-in-parallel or converter-in-parallel alternatives, for example.

FIG. 1 is a schematic block diagram of an exemplary paralleled switching circuit 100. Paralleled switching circuit 100 includes a first bus 102 and a second bus 104. Paralleled switching circuit 100 includes a plurality of phase legs 106 respectively coupled in parallel between first bus 102 and second bus 104, i.e., paralleled phase legs 106. A first current, or input current, is supplied on first bus 102, and a second current, or output current, is received, from phase legs 106 on second bus 104, or vice versa. Each phase leg includes a switching circuit (not shown) configured to conduct a share of a total current supplied in the second current. In a balanced paralleled switching circuit, the respective shares of current conducted through phase legs 106 are substantially equal, e.g., no more than plus-or-minus 2.5% amplitude (amperes) from one phase leg 106 to another. The distribution of the total current through phase legs 106 is referred to as current sharing. Variations among components or in switching timing in phase legs 106, circulating currents, or parasitic currents may result in uneven current sharing among phase legs 106, which may further necessitate a de-rating of the total power capacity of paralleled switching circuit 100. For example, for a paralleled switching circuit having two phase legs 106 each individually rated for 1.0 amperes, with uneven current sharing the total current rating for paralleled switching circuit 100 may be 1.8 amperes as opposed to 2.0 amperes in a balanced paralleled switching circuit. Embodiments of phase legs 106 described herein enable substantially equal current sharing due to synchronous control of phase legs 106, stable current conduction by each phase leg due to a decoupling inductor, and reduction of circulating currents.

In certain embodiments, first bus 102 includes a DC bus having a positive DC line 108 and a negative DC line 110. In such embodiments, paralleled switching circuit 100 may function as a DC-DC converter, e.g., a boost or buck converter, or a DC-AC converter, e.g., an inverter. In DC-DC applications, paralleled switching circuit 100 may step-up or step-down DC voltages for supplying, for example, DC power from a renewable source, such as a photovoltaic array, to an energy storage device, such as a battery. In DC-AC applications, paralleled switching circuit 100 may convert, for example, DC power from a battery or photovoltaic array to an AC power sufficient for supplying to an AC load, e.g., a motor, or an AC utility grid.

In certain embodiments, paralleled switching circuit 100 includes an energy storage capacitor 112 coupled across first bus 102, e.g., across positive DC line 108 and negative DC line 110. The capacitive value of energy storage capacitor 112 varies per application to provide sufficient power capacity for the given application. For example, in one embodiment, energy storage capacitor 112 includes one or more capacitors having a combined capacitance in a range of 100 microfarad to 100 millifarad. Generally, higher-power applications utilize greater energy storage capacitances. Energy storage capacitor 112 should have an operating frequency range, or "rated" frequency, around the switching frequency of paralleled switching circuit 100. For example, paralleled switching circuit 100 may utilize a switching frequency in the range of 1 KiloHertz (KHz) to 100 KHz, and so energy storage capacitor 112 should be rated to operate at least in that frequency range of 1 KHz to 100 KHz.

In certain embodiments, second bus 104 is a DC output bus, e.g., for DC-DC applications. In alternative embodiments, second bus 104 is an AC line that supplies AC power to a load, such as, for example, a motor, electric grid, or any other suitable AC load. In certain such embodiments, paralleled switching circuit 100 further includes a line filter inductor 114 coupled in series with second bus 104. Line filter inductor 114 is generally a large inductance configured to minimize harmonics presented to the load by paralleled switching circuit 100, and are selected based on the power throughput for a given application. For example, in certain embodiments, line filter inductor 114 has an inductance in a range of 1 microhenry to 100 microhenry.

In certain embodiments, paralleled switching circuit 100 includes a current sensor 116 coupled to second bus 104 and configured to detect an amplitude of the second current conducted over second bus 104. Current sensor 116, in certain embodiments, provides a current measurement to a digital signal processor (DSP) 118 or other suitable processing device to enable control of total current conducted through paralleled switching circuit 100.

Each of phase legs 106 includes a decoupling capacitor, one or more semiconductor switches, and a decoupling inductor (not shown). FIG. 2 is a schematic diagram of paralleled switching circuits 200 for use in phase legs 106 of paralleled switching circuit 100 shown in FIG. 1. Each switching circuit 200 includes a first stage 202 coupled to first bus 102, and a second stage 204 coupled to second bus 104. Switching circuit 200 includes a decoupling capacitor 206 and a decoupling inductor 208. Decoupling capacitor 206 is coupled to, or across, first stage 202 and, accordingly, across positive DC line 108 and negative DC line 110 of first bus 102. Decoupling inductor 208 is coupled to second stage 204 and, more specifically, in series with second stage 204.

Generally, switching circuit 200 includes at least one semiconductor switch coupled between first stage 202 and second stage 204, and therefore between first bus 102 and second bus 104. The semiconductor switches may be embodied in one or more power MOSFET, IGBT, or BJT, for example. As illustrated in FIG. 2, switching circuit 200 includes a first semiconductor switch 210 and a second semiconductor switch 212, each coupled between first stage 202 and second stage 204. More specifically, first semiconductor switch 210 is coupled between positive DC line 108 and a midpoint node 214 (located between first semiconductor switch 210 and second semiconductor switch 212), and second semiconductor switch 212 is coupled between negative DC line 110 and midpoint node 214. First semiconductor switch 210 and second semiconductor switch 212 are configured to be controlled to convert a first current received over first stage 202 to a second current supplied to second stage 204 and to second bus 104.

The semiconductor switches, such as first semiconductor switch 210 and second semiconductor switch 212, in switching circuit 200 are generally operated, or commutated, at a selected frequency to produce a desired conversion of the first current at first stage 202 to the second current at second stage 204. Likewise, in at least embodiments where paralleled switching circuit 100 is a DC-AC converter, first semiconductor switch 210 and second semiconductor switch 212 are coordinated, or commutated in an alternating manner, such that while one is open, the other is closed, to produce an alternating polarity signal at second stage 204, i.e., an AC signal. Generally, high-frequency switching of the semiconductor switches can produce a higher-quality output signal, but produces increasing amounts of noise and circulating currents. Accordingly, many known switching circuits, such as device-in-parallel or converter-in-parallel alternatives, limit switching frequency (beyond physical limits of the semiconductor devices themselves) to contain noise, and reduce the effects of circulating currents. In embodiments of switching circuit 200 described herein, the provision of decoupling inductor 208 and decoupling capacitor 206 enables greater utilization of high switching frequencies by locally containing the contributing noise and suppressing parasitics or circulating currents to paralleled switching circuit 100. For example, in at least some embodiments, first semiconductor switch 210 and second semiconductor switch 212 are commutated at a switching frequency of 200 KHz or greater. In alternative embodiments, where acceptable for paralleled switching circuit 100, first semiconductor switch 210 and second semiconductor switch 212 are commutated at a switching frequency in the range of 1 KHz to 100 KHz. In other embodiments, first semiconductor switch 210 and second semiconductor switch 212 are commutated at a switching frequency in the range of 1 KHz to 10 KHz.

In at least some embodiments, paralleled switching circuit 100 includes gate driver circuits 216 and 218 coupled respectively to first and second semiconductor switches 210 and 212 in each phase leg 106. Gate driver circuits 216 and 218 are controlled independently to synchronize control of first and second semiconductor switches 210 and 212. Gate driver circuit 216 is coupled to each phase leg 106 and is configured to control first semiconductor switch 210 in each phase leg 106. Likewise, gate driver circuit 218 is coupled to each phase leg 106 and is configured to control second semiconductor switch 212 in each phase leg 106. In at least some embodiments, paralleled switching circuit 100 includes DSP 118 (shown in FIG. 1) for controlling gate driver circuits 216 and 218, and semiconductor switches in phase legs 106. More specifically, DSP 118 is coupled to respective gate driver circuits for respective semiconductor switches in each switching circuit 200 and is configured to synchronously control the respective gate driver circuits in a complementary manner to convert the first current to the second current, e.g., DC to AC or DC to DC. In controlling gate driver circuits 216 and 218, and therefore first semiconductor switches 210 and second semiconductor switches 212 in each phase leg 106, DSP 118 enables substantially equal shares of the total current through paralleled switching circuit 100 to be conducted through each switching circuit 200. Synchronous control of commutation of the semiconductor switches among each switching circuit 200 includes, for example, simultaneous commutation of first semiconductor switch 210 in each switching circuit 200 by gate driver circuit 216. Likewise, synchronous control further includes the alternating commutation of first semiconductor switch 210 and second semiconductor switch 212 in each switching circuit 200 such that, in each phase leg 106, while first semiconductor switch 210 is open, second semiconductor switch 212 is closed, and vice versa.

Decoupling inductor 208 is coupled between midpoint node 214 and second stage 204. Accordingly, decoupling inductor 208 is coupled in series between first semiconductor switch 210 and second stage 204 (and second bus 104). Likewise, decoupling inductor 208 is coupled in series between second semiconductor switch 212 and second stage 204. Decoupling inductor 208 provides a defined di/dt (rate of change in current over time) that prevents abrupt changes in current output to second bus 104, e.g., an AC bus, during brief periods of time for dynamic transitions, e.g., commutation of first semiconductor switch 210 and second semiconductor switch 212. Decoupling inductor 208 generally has an inductance value in a range of 1/100 to 1/10 of, or at least one order of magnitude less than, the inductance value of line filter inductor 114. For example, in certain embodiments, decoupling inductor 208 is an inductor having an inductance in a range of 100 nanohenry to 1 microhenry, i.e., at least one order of magnitude less than line filter inductor 114. Further, decoupling inductor 208 generally should have good high-frequency characteristics, e.g., rated for operation at frequencies in the range of 100 KHz to 100 MHz. In contrast, line filter inductor 114 generally lacks such high-frequency characteristics, because it is generally rated for operation at or around line frequency (e.g., 50-200 Hertz (Hz)), or around the switching frequency of first and second semiconductor switches 210 and 212 (e.g., 1 KHz to 100 KHz). At high frequencies, e.g., 100 KHz to 100 MHz, line filter inductor 114 functions as an electrical equivalent to a capacitor and would not perform the decoupling functions of decoupling inductor 208. Accordingly, decoupling inductor 208 reduces high-frequency noise on second bus 104 and reduces circulating currents conducted between phase legs 106, because current output from each phase leg 106 is decoupled from second bus 104.

Decoupling capacitor 206 is coupled across first bus 102 and provides a defined dv/dt (rate of change in voltage over time) to prevent abrupt changes in voltage on first bus 102, e.g., a DC bus. Decoupling capacitor 206 generally has a capacitance value in a range of 1/100 to 1/10 of the capacitive value, or one to two orders of magnitude less than the capacitive value of energy storage capacitor 112. Decoupling capacitor 206, in certain embodiments, has a capacitance in the range of 1 nanofarad to 100 nanofarad. For example, in one embodiment, decoupling capacitor 206 has a capacitance of 10 nanofarad. Accordingly, decoupling capacitor 206 has a capacitance value that is at least one order of magnitude less than that of energy storage capacitor 112, depending on the energy storage demands of a given application. Further, decoupling capacitor 206 generally should have good high-frequency characteristics, e.g., rated for operation at frequencies in the range of 100 KHz to 100 MegaHertz (MHz). In contrast, energy storage capacitor 112 generally lacks such high-frequency characteristics, being rated for frequencies in the range around the switching frequency of first and second semiconductor switches 210 and 212. At high frequencies, e.g., 100 KHz to 100 MHz, energy storage capacitor 112 functions as an electrical equivalent of an inductor and would not perform the decoupling function of decoupling capacitor 206.

The above described embodiments of a switching circuit for a phase leg in, for example, a paralleled switching circuit provide a fully-decoupled phase leg that can be paralleled between a first bus and a second bus, such as between a DC bus and an AC bus or between two DC buses. At least some embodiments of the switching circuit described herein include a decoupling inductor at a second stage to stabilize current output over time, e.g., to filter high-frequency noise at the second stage. At least some embodiments of the switching circuit described herein include a decoupling capacitor at a first stage to stabilize voltage input over time, e.g., to filter high-frequency noise at the first stage. Being fully-decoupled from the first and second buses enables the switching circuit described herein to provide desirable levels of current sharing and reduces parasitics and circulating currents. Accordingly, such switching circuits are not subject to de-rating. At least some embodiments of the switching circuit described herein include an individual gate driver for each switch device, e.g., power semiconductor switch, power MOSFET, insulated gate bipolar transistor (IGBT), bipolar junction transistor (BJT), or other suitable switching device. Control of the switching circuit described herein is, accordingly, simple and cost effective. Embodiments of the switching circuit described herein are efficient and scalable, and contribute little noise to external circuits relative to device-in-parallel or converter-in-parallel alternatives, for example.

An exemplary technical effect of the methods, systems, and apparatus described herein includes at least one of: (a) fully-decoupled switching circuits for phase legs in a paralleled switching circuit; (b) improving steady-state and dynamic current sharing among phase legs due to decoupling; (c) reducing complexity and cost of control circuits for respective phase legs due to a common gate drive circuit to control the same position switch device in each phase leg; (d) reducing circulating current among phase legs due to decoupling; (e) avoiding de-rating of paralleled switching circuits or other systems in which switching circuits are embodied due to improved current sharing among phase legs; (f) improving scalability due to utilization of low-cost and readily available discrete components and printed circuit board implementation, and due to reduction in component-count and circuit area as a benefit of avoidance of de-rating; and (g) reducing noise introduced to external circuits on both the source-side and load-side of the switching circuit.

Exemplary embodiments of methods, systems, and apparatus for switching circuits are not limited to the specific embodiments described herein, but rather, components of systems and/or steps of the methods may be utilized independently and separately from other components and/or steps described herein. For example, the methods may also be used in combination with other non-conventional switching circuits, and are not limited to practice with only the systems and methods as described herein. Rather, the exemplary embodiment can be implemented and utilized in connection with many other applications, equipment, and systems that may benefit from reduced cost, reduced complexity, commercial availability, improved manufacturability, and reduced product time-to-market.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A switching circuit, comprising:

a first stage configured to be coupled directly to a first line and a second line of a first bus;

a second stage configured to be coupled to a second bus;

a decoupling inductor coupled to said second stage;

a decoupling capacitor coupled across said first stage directly between the first line and the second line;

a semiconductor switch system comprising a first semiconductor switch and a second semiconductor switch coupled between said first stage and said second stage and configured to be controlled to convert a first current received at said first stage to a second current supplied to said second stage; and a gate driver circuit system coupled to and configured to operate said semiconductor switch system, said gate driver circuit system comprising a first gate driver circuit coupled to said first semiconductor switch and a second gate driver circuit coupled to said second semiconductor switch, wherein said switching circuit is configured to be coupled in parallel with a plurality of other switching circuits that each include an associated first semiconductor switch, an associated second semiconductor switch, and an associated decoupling capacitor, each decoupling capacitor configured to suppress transmission of parasitic currents to the other switching circuits, wherein said first gate driver circuit is coupled to the associated first semiconductor switch of each of the plurality of other switching circuits and configured to provide a first control signal to the first semiconductor switch and the associated first semiconductor switch of each of the plurality of other switching circuits, wherein said second gate driver circuit is coupled to the associated second semiconductor switch of each of the plurality of other switching circuits and configured to provide a second control signal to the second semiconductor switch and the associated second semiconductor switch of each of the plurality of other switching circuits, and wherein said first gate driver circuit and said second gate driver circuit are controlled independently to (i) synchronize control of said first semiconductor switch and the associated first semiconductor switch of each of the plurality of other switching circuits using the first control signal, (ii) synchronize control of said second semiconductor switch and the associated second semiconductor switch of each of the plurality of other switching circuits using the second control signal, and (iii) provide substantially equal current sharing among said switching circuit and the plurality of other switching circuits.

2. The switching circuit of claim 1, wherein said first stage comprises a positive direct current (DC) line and a negative DC line, and wherein said decoupling capacitor is coupled across said positive DC line and said negative DC line.

3. The switching circuit of claim 2, wherein said first semiconductor switch is coupled between said positive DC line and said second stage at a midpoint node, and wherein said second semiconductor switch is coupled between said negative DC line and said second stage at the midpoint node, said second semiconductor switch configured to be controlled in coordination with said first semiconductor switch to convert the first current to the second current.

4. The switching circuit of claim 3, wherein said decoupling inductor is coupled in series between the midpoint node and said second stage.

5. The switching circuit of claim 1, wherein said decoupling capacitor comprises a capacitor having a capacitance in a range of $1/100$ to $1/10$ of a capacitance value of an energy storage capacitor for the switching circuit.

6. The switching circuit of claim 1, wherein said decoupling inductor comprises an inductor having an inductance in a range of $1/100$ to $1/10$ of an inductance value of a line filter inductor for the switching circuit.

7. A paralleled switching circuit, comprising:

a first bus configured to supply a first current, the first bus comprising a first line and a second line;

a second bus configured to receive a second current;

a plurality of phase legs respectively coupled between said first bus and said second bus, each phase leg comprising a switching circuit configured to conduct a share of a total current supplied in the second current, each said switching circuit comprising:

a decoupling capacitor coupled directly to said first line and said second line of said first bus, the decoupling capacitor configured to suppresses transmission of parasitic currents from the associated switching circuit to the switching circuits of other phase legs of the plurality of phase legs;

a semiconductor switch system comprising a first semiconductor switch and a second semiconductor switch coupled between said first bus and said second bus, said semiconductor switch system configured to be controlled to convert the first current to the second current; and a decoupling inductor coupled in series between said semiconductor switch and said second bus; and a gate driver circuit system coupled to and configured to operate said semiconductor switch system of each switching circuit, said gate driver circuit system comprising a first gate driver circuit coupled to and configured to provide a first control signal to said first semiconductor switch of each switching circuit, said gate driver circuit further comprising a second gate driver circuit coupled to and configured to provide a second control signal to said second semiconductor switch of each switching circuit, wherein said first gate driver circuit and said second gate driver circuit are controlled independently to (i) synchronize control of said first semiconductor switch of each of the plurality of phase legs using the first control signal, (ii) synchronize control of said second semiconductor switch of each of the plurality of phase legs using the second control signal, and (iii) provide substantially equal current sharing among said semiconductor switch system of each of the plurality of phase legs switching circuits.

8. The paralleled switching circuit of claim 7, wherein said first bus comprises a positive direct current (DC) line and a negative DC line.

9. The paralleled switching circuit of claim 8 further comprising an energy storage capacitor coupled between said positive DC line and said negative DC line.

10. The paralleled switching circuit of claim 9, wherein said energy storage capacitor comprises one or more capacitors having a combined capacitance in a range of 100 microfarad to 100 millifarad.

11. The paralleled switching circuit of claim 8, wherein said first semiconductor switch is coupled between said positive DC line and said decoupling inductor, and wherein said second semiconductor switch is coupled between said negative DC line and said decoupling inductor, wherein said first gate driver circuit and said second gate driver circuit operate in a complementary manner to provide substantially equal current sharing among said plurality of phase legs.

12. The paralleled switching circuit of claim 11 further comprising a digital signal processor (DSP) coupled to said first gate driver circuit and said second gate driver circuit, said DSP configured to control respective gate driver circuits for respective semiconductor switches in each switching circuit to convert the first current to the second current and provide the substantially equal current sharing among said plurality of phase legs.

13. The paralleled switching circuit of claim 12, wherein said DSP is further configured, in controlling the respective gate driver circuits, to conduct substantially equal respective shares of the total current through each of said switching circuits.

14. The paralleled switching circuit of claim 12, wherein said DSP is further configured, in controlling the respective gate driver circuits, to commutate the respective semiconductor switches at a switching frequency in a range of 1 KiloHertz to 1 MegaHertz.

15. The paralleled switching circuit of claim 8, wherein said second bus comprises a DC output bus.

16. The paralleled switching circuit of claim 7, wherein said second bus comprises an alternating current (AC) line.

17. The paralleled switching circuit of claim 16 further comprising a line filter inductor coupled in series with said second bus.

18. The paralleled switching circuit of claim 17 wherein said line filter inductor comprises an inductor having an inductance in a range of 1 to 100 microhenry.

19. The paralleled switching circuit of claim 7 further comprising a current sensor coupled to said second bus and configured to detect an amplitude of the second current conducted over said second bus, and to provide a current measurement signal to a digital signal processor (DSP).

* * * * *